United States Patent [19]

Kasold et al.

[11] Patent Number: 5,208,772
[45] Date of Patent: May 4, 1993

[54] GATE EEPROM CELL

[75] Inventors: Jeffrey P. Kasold, San Jose, Calif.; Chung H. Lam, Troy, N.Y.

[73] Assignee: International Business Machines Corporation, Armonk, N.Y.

[21] Appl. No.: 869,469

[22] Filed: May 28, 1986

Related U.S. Application Data

[63] Continuation of Ser. No. 655,175, Sep. 27, 1984, abandoned.

[51] Int. Cl.$^5$ ............................................. B11C 16/04
[52] U.S. Cl. ............................. 365/185; 365/189.09; 365/218; 257/320; 257/325
[58] Field of Search ................... 365/185, 189.09, 218; 357/23.5

[56] References Cited

U.S. PATENT DOCUMENTS

| | | | |
|---|---|---|---|
| 3,825,946 | 7/1974 | Frohman-Bentchkowsky | 365/185 |
| 3,906,296 | 9/1975 | Maserjian et al. | 365/185 |
| 4,099,196 | 7/1978 | Simko | 357/23 |
| 4,104,675 | 8/1978 | DiMaria . | |
| 4,119,995 | 10/1978 | Simko | 357/23 |
| 4,274,012 | 1/1979 | Simko | 307/238.3 |
| 4,300,212 | 10/1981 | Simko | 365/185 |
| 4,314,265 | 2/1982 | Simko | 357/23 |
| 4,334,292 | 6/1982 | Kotecha | 365/182 |
| 4,336,603 | 6/1982 | Kotecha et al. | 365/182 |
| 4,375,085 | 2/1983 | Grise et al. | 365/104 |
| 4,380,057 | 4/1983 | Kotecha et al. | 365/185 |
| 4,449,205 | 5/1984 | Hoffman | 365/182 |

FOREIGN PATENT DOCUMENTS

| | | |
|---|---|---|
| 48714 | 4/1982 | European Pat. Off. . |
| 83386 | 7/1983 | European Pat. Off. . |
| 2466834 | 4/1981 | France . |

OTHER PUBLICATIONS

H. N. Kotecha et al, *IEEE International Solid-State Circuits Conf., Digest of Technical Papers,* Feb. 18, 1981, pp. 38, 39, "A Dual-Gate Floating-Gate FET Device".
Young, "Storage Cell for Electronically Alterable Read-Only Storage Arrays Using Dual Electron Injector Structure Charge Injectors," *IBM Technical Technical Disclosure Bulletin,* vol. 24, No. 3, Aug. 1981, pp. 1541–1542.
Torelli, "An LSI Technology Fully Compatible EAROM Cell," *Alta Frequenza,* vol. 51, No. 6, Nov./Dec. 1982, pp. 345–351.
Lee, "A New Approach for a Floating-Gate MOS Non-Volatile Memory" *Applied Phy. Letters,* vol. 31, No. 7, Oct. 1977, pp. 475–476.
Hoffman, "Floating Gate Non-Volatile Memory Cell", *IBM Technical Bulletin,* vol. 22, No. 6, Nov. 1979, pp. 2403–2404.

*Primary Examiner*—Joseph L. Dixon
*Assistant Examiner*—Jack A. Lane
*Attorney, Agent, or Firm*—Mark F. Chadurjian

[57] ABSTRACT

A non-volatile memory cell uses two different areas for electron injection, allowing direct overwriting of previously stored data without an intervening erase cycle. A floating gate FET has dual programming gates disposed on its floating gate. Each programming gate includes a layer of dual electron injector structure (DEIS) and a polysilicon electrode. When writing a "0", one of the programming gates removes charge from the floating gate. When writing a "1", the other programming gate injects charge into the floating gate. The above charge transfer does not take place if the previously stored logic gate and the logic state to be written in are identical.

14 Claims, 1 Drawing Sheet

GATE EEPROM CELL

This application is a continuation of Ser. No. 06/655,175 filed Sep. 27, 1984 now abandoned.

CROSS REFERENCE TO RELATED APPLICATIONS

Reference is made to co-pending U.S. patent applications Ser. No. 65,176, C. H. Lam, entitled "Non-Volatile Dynamic Random Access Memory Cell"; and Ser. No. 655,134, C. H. Lam and B. A. Kauffmann, entitled "Non-Volatile Dynamic Random Access Memory Cell", filed Sep. 27, 1984 and assigned to the assignee of the present invention.

TECHNICAL FIELD OF THE INVENTION

The invention relates to the field of electrically erasable programmable read only memories (EEPROMs).

BACKGROUND ART

Non-volatile floating-gate MOS memories are well known in the industry. In such devices, the conductive state of a FET is determined by the voltage on a "floating gate". This voltage is set by induced avalanche injection or tunneling of electrons from a depletion region formed in a semiconductor substrate, through a gate insulation layer, to the gate electrode. Previously, this preset logic state could only be altered by first removing (or "erasing"; the accumulated charge by methods such as ultraviolet light irradiation.

More recently, designs have been proposed which facilitate the erasure and resetting of the voltages on these floating gates. For example, in U.S. Pat. No. 4,119,995 (issued Oct. 10, 1978 to Simko and assigned to Intel Corporation) the floating gate is controlled by separate programming and erasure gates which are disposed above the floating gate and insulated therefrom by an oxide layer. The floating gate voltage is programmed in the manner discussed above. The charge on the floating gate is erased by causing electrons to flow from the floating gate up to the erasing gate.

Other designs have been proposed which utilize charge transfer between the floating gate and one or more control gates to both erase and program the floating gate (i.e., in these designs, the tunnelling or avalanche of electrons from a structure other than a substrate region is used to set the voltage of the floating gate). See e.g. Lee, "A New Approach for the Floating-Gate MOS Nonvolatile Memory", *Applied Physics Letters*, Vol. 31, No. 7, October 1977, pp. 475-476. This paper discloses a single control gate separated from the floating gate by a poly-oxide layer. When the control gate is biased positive for writing, electron flow is induced from the floating gate to the control gate. Since this flow is greater than the flow of electrons from the substrate to the floating gate, the floating gate accumulates positive charge. When the control gate is ramped negative to erase, the floating gate accumulates negative charge. See also U.S. Pat. Nos. 4,099,196; 4,274,012; 4,300,212; and 4,314,265 (issued Jul. 4, 1978, Jan. 24, 1979, Aug. 10, 1981 and Feb. 2, 1982, respectively, to Simko) which disclose erasable PROM's wherein a programming gate is disposed below the floating gate and an erasure gate is disposed above the floating gate. The devices are programmed by inducing electron flow from the program gate to the control gate and are erased by inducing electron flow from the floating gate to the erasing gate. In all four patents, the surface of one or more of the gates is roughened in order to enhance the induced electric fields. This promotes electron flow through the oxide layers separating the gates.

Among the materials which have been used to enhance charge injection is the so-called dual electron injector structure (DEIS), which is a layer of $SiO_2$ having excess silicon crystals on its upper and lower surfaces. This structure is disclosed in U.S. Pat. No. 4,104,675 (issued to DiMaria and assigned to the assignee of the present application). A DEIS layer is generally formed by a chemical vapor deposition process which induces extra silicon crystal growth both prior and subsequent to the formation of an otherwise normal $SiO_2$ layer. Several patents specifically disclose the use of a DEIS layer as the injector structure for a non-volatile ROM. See e.g., U.S. Pat. No. 4,336,603 (issued Jun. 22, 1982 and assigned to the assignee of the present application). This patent discloses a single control gate which injects electrons into the floating gate through the DEIS layer.

SUMMARY OF THE INVENTION

It is an object of the present invention to provide an improved electrically erasable programmable memory cell.

It is another object of the invention to provide a memory cell in which data can be written into the cell without first erasing the existing data stored therein.

It is yet another object of the invention to provide a memory cell which is of a comparatively uncomplicated design, necessitating a minimum of support circuitry.

These and other objects of the invention are realized by a memory cell which includes a semiconductor substrate having a plurality of diffusions formed therein, a floating gate insulated from the substrate, and a pair of programming gates disposed above the floating gate. Each programming gate includes a layer of DEIS material which is overlayed by a polysilicon layer.

In operation, when a first binary logic state is to be written into the cell, electrons will flow from the floating gate to one of the programming gates. When a second binary logic state is to be written into the cell, electrons will be injected by the other of the programming gates into the floating gate. Due to the characteristics of the DEIS layer, the foregoing charge transfer will not occur if the logic state to be written in is the same as the logic state currently stored by the cell. Moreover, if a logic state to be written in is the opposite of the logic state currently stored, the logic state will be written in without any additional steps (i.e., there is no need to erase the old logic state prior to writing in the new logic state).

BRIEF DESCRIPTION OF THE DRAWINGS

The foregoing and other objects, features and advantages of the present invention will become more apparent upon a detailed description of the best mode for carrying out the invention. In the description to follow, reference will be made to the accompanying drawings, in which.

BEST MODE FOR CARRYING OUT THE INVENTION

Figure 1:
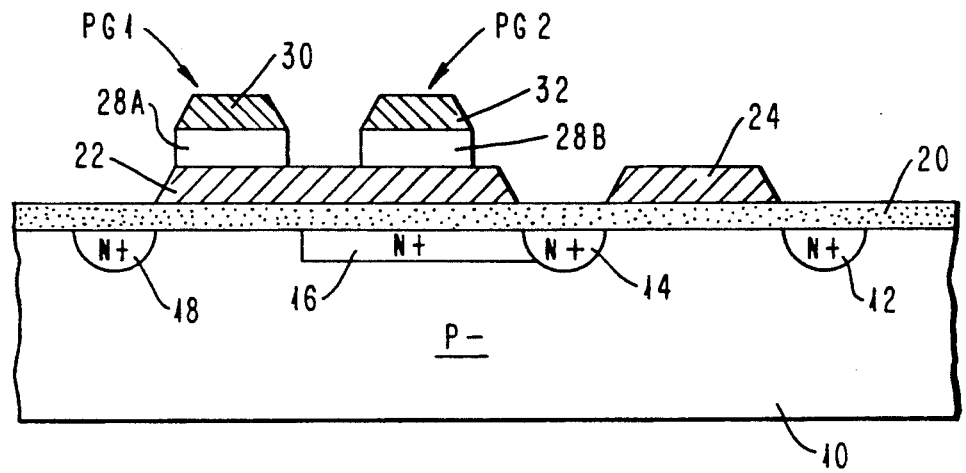
FIG. 1 is a cross-sectional view of the memory cell of the invention.

With reference to FIG. 1, the structure of the memory cell will be described. A p-type substrate 10 has n-type diffusions 12, 14, 16 and 18 formed therein via typical implantation techniques. Note that these conductivity types can be reversed. The n-type diffusions 14 and 18 are the source and drain diffusions, respectfully, of an FET having a floating gate electrode. Diffusion 16 serves as an extension of source diffusion 14 beneath the floating gate, such that diffusions 16 and 18 define the channel region of the floating gate FET therebetween. A source node is defined where diffusions 14 and 16 border on one another. Diffusion 12 is a diffused bit line which receives data signals from an external data source.

Substrate 10 is covered by an insulator layer 20. Any sort of insulator (e.g., SiO2) can be used. Insulator layer 20 is then covered by a first polycrystalline silicon layer, which is etched using conventional techniques to form floating gate electrode 22 and a word line electrode 24. The word line electrode 24, in conjunction with diffusion regions 12 and 14, forms a typical word line transfer device.

A layer of DEIS material 28A and 28B is then formed on floating gate 24 using the techniques previously discussed. A second layer of polycrystalline silicon is then deposited. The second polysilicon layer and the DEIS layer are etched (using conventional techniques) to form first and second program gates PG1 and PG2. Program gate PG1 includes a first region 30 of the second polysilicon layer overlaying a first region 28A of the etched DEIS layer. Program gate PG2 includes a second region 32 of the second polysilicon layer overlaying a second region 28B of the etched DEIS layer. Although the two polysilicon regions 30 and 32 appear to be of similar area in FIG. 1, in practice region 30 is much larger than region 32. This size difference effects the respective capacitances of PG1 and PG2, as will be discussed in more detail below.

Figure 2A:
FIGS. 2A and 2B are diagrams illustrating the conductive characteristics of the DEIS layer.
Figure 2B:
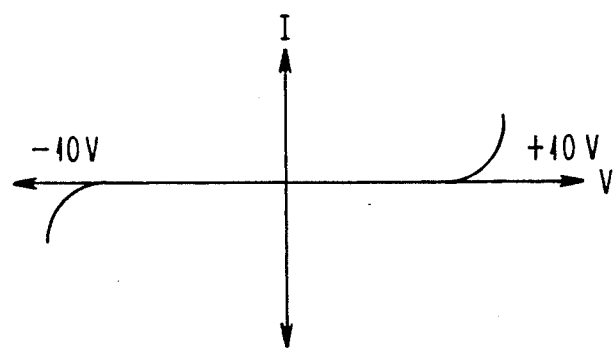

Prior to discussing the operation of the cell, the characteristic of the DEIS layer will now be reviewed. Due to the electron flow enhancement properties of the surfaces of the DEIS layer with respect to the inner SiO2, each surface of the DEIS layer has an inherent diode characteristic. Since the respective surfaces of the DEIS layer promote electron flow in different directions, the total layer acts as (i.e. has the electrical characteristic of) two back-to-back connected diodes, as shown in FIG. 2A. As shown in FIG. 2B, it is preferred that the DEIS layer be formed such that these diodes begin conduction at approximately ±10 volts. Thus, while the use of DEIS material is preferred, any sort of charge injector material or structure can be used which provides the above-described characteristics.

Figure 3:
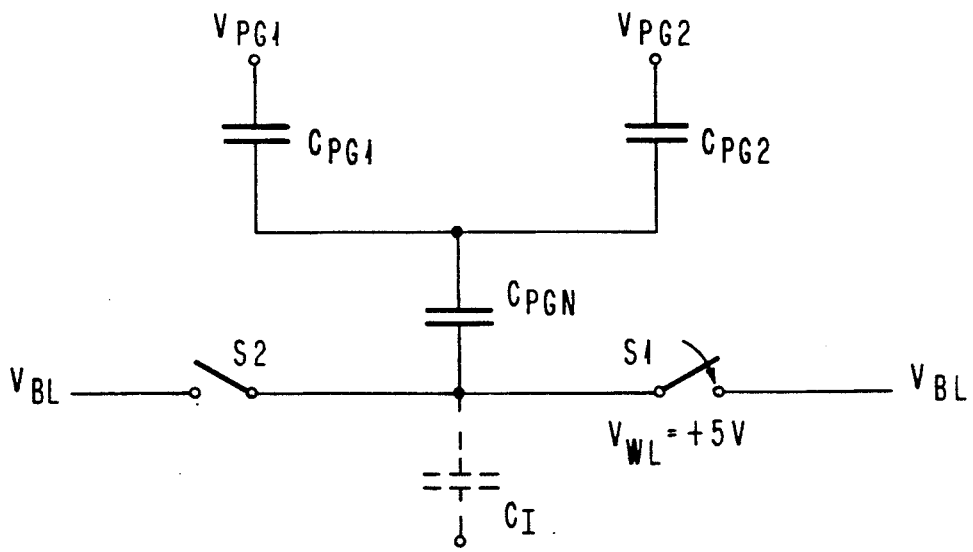
FIG. 3 is an equivalent circuit of the memory cell of the invention.

The operation of the invention will now be described with reference to FIG. 3, which is an equivalent circuit of the cell of FIG. 1. $C_{PG1}$ is the capacitance formed by DEIS region 28A between polysilicon region 30 and floating gate 22; $C_{PG2}$ is the capacitance formed by DEIS region 28B between polysilicon region 32 and floating gate 22; $C_{FGN}$ is the capacitance formed by insulator layer 20 between floating gate 22 and N+ diffusion 16; and $C_J$ is the depletion capacitance formed between the N+ type diffusion 16 and the substrate 10 when both drain diffusion 18 and source diffusion 14 are brought high therefor. S1 represents the word line device, which switches $V_{BL}$ onto the substrate when $V_{WL}$ on the word line electrode goes to +5 volts. Likewise, S2 represents the floating gate transistor itself, which connects the drain to the substrate when either the floating gate voltage is greater than $V_T$ or the program gate voltage $V_{PG1}$ is greater than $V_{DD}$ (= +5V). For the sake of clarity, the various parasitic capacitances inherent in the memory cell have been deleted from the equivalent circuit of FIG. 3. This equivalent circuit has been found to present an accurate first order approximation of the performance of the memory cell.

In the discussion of the operation of the memory cell, the following normalized capacitances will be assumed by way of example:

$C_{PG1} \approx 1.0$ $C_{PG2} \approx 0.2$ $C_{FGN} \approx 1.0$ $C_J \approx 0.1$ The capacitance of $C_{PG1}$ is much greater than that of $C_{PG2}$ since the polysilicon region 30 (and hence the DEIS region 28A) is much larger than region 32.

The operation of the memory cell of FIG. 1 will now be described with reference to FIG. 3. In general, a logic state is written into a cell via a two step process. First, the floating gate is charged to an initial voltage by injection/removal of electrons. Then the various control voltages are dropped to their quiescent levels, setting the final voltage on the gate.

Initially, if a "0" is to be written into the cell, the bit line is grounded ($V_{BL}=0$ volts) and the word line is then raised to VDD ($V_{WL} \approx +5$ volts). This causes source diffusion 14 and N+ diffusion 16 to be grounded. In the equivalent circuit, $V_{WL}= +5$ V causes the word line device "switch" to be closed, such that $C_{FGN}$ is connected to ground potential. Since drain diffusion 18 is at VDD = +5 V, a channel forms between drain diffusion 18 and n-type diffusion 16. At the same time, PG2 is grounded ($V_{PG2}=0$ volts). After a small delay to allow channel formation, the voltage on PG1 is raised to +20 volts. This delay is determined by monitoring the word line voltage (i.e., $V_{PG1}$ is raised a predetermined time after $V_{WL}=5$ V). In general, the initial voltage on floating gate due to these control voltage states is given by the equation $$V_{FG} = \chi_W V_{PG1} \quad (1)$$

where $\chi_W$ is the capacitive coupling of the equivalent circuit during the initial write operation. Under these circumstances (i.e. $C_{PG2}$ and $C_{FGN}$ connected to ground), $$\chi_W = \chi_{"0"} = \frac{C_{PG1}}{C_{FGT"0"}} \quad (2)$$

where $$C_{FGT"0"} = C_{PG1} + C_{PG2} + C_{FGN} \quad (3)$$

such that the capacitive coupling is approximately 0.45 and $V_{FG} = (0.45)(20) = 9.0$ volts. With reference to FIG.

2B, recall that the DEIS layer will conduct only if the potential difference between the diode plates is greater than 10 volts. Thus, PG2 will not conduct, since the potential difference between the $V_{FG}$ and $V_{PG2}$ (9 V −0 V = 9 volts) is not greater than 10 volts. However, PG1 will conduct, since $V_{PG1} - V_{FG} = 20 - 9 = 11$ volts. PG1 will thus remove electrons from the floating gate (since the electrons are attracted to the higher potential of +20 V) to the point where the floating gate has received an effective charge of +1.0 volts. When this occurs, conduction stops since the potential difference is no longer greater than +10 V.

The final "0" voltage of the floating gate is now set when PG1 and PG2 are returned to their quiescent levels of +5 V. At this juncture, the voltage on the floating gate can be expressed as $$V_{FG} = \chi_{no} V_{PG1} + Q_{FG}/C_{FGT} \quad (4)$$

where $Q_{FG}$ the charge removed from the floating gate during the above-described writing operation. Under these circumstances, (i.e. $V_{PG2} = V_{PG1} = 5$ V):

$$\chi_{no} = \frac{C_{PG1} + C_{PG2}}{C_{PG1} + C_{PG2} + C_{FGN}}, \quad (5)$$

such that the capacitive coupling during the quiescent state is 0.54 and the final voltage on the floating gate = (0.54)(5.0) + (1.0) = +3.7 V.

When a "1" is to be written into the cell, the control voltages are the same as those used to write in a "0". The word line is brought up to $V_{DD} = 5.0$ V, as is PG2, and PG1 is brought up to +20 V after a delay. The main difference is that the bit line voltage $V_{BL}$ is raised to $V_{DD}$, such that the source diffusion 14 and the n+ diffusion 16 are raised to $V_{DD} - V_T$, or approximately +5 V. Since both the drain and source diffusions are at +5 V, an inversion layer forms between n-type region 16 and substrate 10. This inversion layer has a depletion capacitance $C_I$ of approximately 0.1 normalized. Recalling from Equation 1 that $V_{FG} = \chi_w V_{PG1}$, $$\chi_W = \chi_{"1"} = \frac{C_{PG1}}{C_{FGT"1"}}, \quad (6)$$

where $$C_{FGT"1"} = C_{PG1} + C_{PG2} + \frac{(C_{FGN})(C_I)}{C_{FGN} + C_I} \quad (7)$$

such that $\chi_{"1"} \approx 0.77$ and thus $V_{FG} \approx (0.77)(20) = +15.4$ V when a "1" is to be written. With reference to FIG. 2B, PG1 will not conduct since the potential difference (20 − 15.4) is not greater than 10 volts. However, PG2 will conduct, since the potential difference (15.4 − 0) is greater than 10 V. In this case, electrons will be injected by PG2 into the floating gate, until the voltage on the floating gate decreases to 10 volts. Thus, the floating gate received −5.4 volts worth of charge from PG2. When the control voltages are then removed (i.e. $V_{PG1} = V_{PG2} = 5.0$ V), the charge on the floating gate decreases to −3.2 volts, since the depletion capacitance is removed and hence $C_{FGT}$ rises from $C_{FGT"1"}(\approx 1.3)$ to $C_{FGT"0"}(\approx 2.2)$. Thus, with $Q_{FG}/C_{FGT} = -3.2$ V, $V_{PG} = +5.0$ V, and $\chi_{no} = 0.54$, $V_{FG} = (0.54)(5.0) - 3.2 = -0.5$ volts.

Thus, with the capacitive values given above, the floating gate will store +3.7 volts when a "0" is written in and −0.5 volts when a "1" is written in. The cell is read in the ordinary manner. That is, the bit line is brought low and the drain is sensed. If a "0" is stored, the positive voltage on the floating gate will induce a channel, such that the device conducts and the charge on the drain will decrease. If a "1" is stored, the negative voltage on the floating gate will not induce a channel, and there will be no change in the charge on the drain. Thus, it is the state of the channel which indicates the stored data state.

The foregoing description of the operation of the cell was made with the assumption that the floating gate was devoid of charge when the writing operation was initiated. An important feature of the invention is that the new data can be written over the old data without the need for an intervening erasure of the old data. This feature will now be discussed in more detail. During the discussion, reference will be made to the following two relationships:

(A) $V_{FGI} = \chi_{"0"/"1"} V_{PG1} + Q_{FG}/C_{FGT"0"/"1"}$
where
$V_{FGI}$ = the new voltage of the floating gate at the end of the initial writing step;
$\chi_{"0"/"1"} V_{PG1}$ = the voltage on the floating gate at the end of the initial step assuming no previous floating gate charge; and
$Q_{FG}/C_{FGT"0"/"1"}$ = the voltage on the floating gate due to the previous charge storage;
and (B) $V_{FGQ} = \chi_{no} V_{PG1} + \frac{Q_{FGN} + Q_{FG"0"/"1"}}{C_{FGT"0"}}$ where
$V_{FGQ}$ = the final voltage upon quiescent conditions (= −0.5 V for a stored "1", +3.7 V for a stored "0");
$\chi_{no} V_{PG1}$ = the component of the final voltage which is due to the voltage on the first program gate (note that since $V_{PG1}$ always = 5.0 volts upon quiescent conditions and $\chi_{no}$ always = 0.54 with the given capacitive values, this term alway = +2.7 volts); and $\frac{Q_{FGN} + Q_{FG"0"/"1"}}{C_{FGT"0"}}$ = the final voltage on the floating gate due to the newly injected charge as well as the previously stored charge. Note that $C_{FGT}$ always equals $C_{FGT"0"}$ upon quiescent conditions.

(1) Cell at "0" state, write in a "0": Under these circumstances, the voltage on the floating gate $V_{FGI} = (+1.0) + (+9.0) = 10$ volts. That is, the floating gate has +1 volts worth of charge on it due to the previous storage of a "0", and it acquires +9 volts during the present writing in of a "0". Thus there will not be any charge injection, and the voltage on the floating gate after the cell is returned to its quiescent state $V_{FGQ} = 2.7 + 0 + 1 = +3.7$ volts.

(2) Cell at "0" state, write in a "1": Here, $V_{FGI} = +15.4 + 1.7 = +17.1$ volts. Note that the "$Q_{FG}/C_{FGT}$" term has risen from 1.0 as in (1) above to 1.7, since CFGT has dropped from $C_{FG"0"}$ to $C_{FG"1"}$. Thus, −7.1 volts will be initially injected into the floating gate by PG2. Upon quiescent conditions, $V_{FGQ} = 2.7 - 4.2 + 1 = -0.5$ volts. Note that the newly injected charge ($= -4.2$ volts) has dropped from $-7.1$ volts since the inversion capacitance $C_I$ is dropped upon quiescent conditions; the old injected charge ($= +1$ volt) is due to the fact that a "0" was previously stored on the floating gate.

(3) Cell at "1" state, write in a "1": Here, $V_{FGI} = +15.4\ V - 5.4\ V = 10\ V$. The $-5.4$ volts arises from the previous storage of a "1". Thus, there will be no charge injection and the voltage upon quiescent conditions $V_{FGQ} = 2.7 + 0 - 3.2 = -0.5$ volts.

(4) Cell at "1" state, write in a "0": Under these circumstances, $V_{FGI} = 9.0 - 3.2 = +5.8$ volts, such that $+4.2$ volts of charge will be removed from the floating gate and $V_{FGQ} = 2.7 + 4.2 - 3.2 = +3.7$ volts.

Thus, as discussed above, the memory cell of the invention has the ability to write new information over previously stored information without an intervening erasure step. Moreover, the operation of the memory cell is relatively simple, requiring a minimum of support and/or decode circuitry (e.g., the voltages on PG2 and the word line are equal to $+\text{VDD}$ when writing in a "0" or a "1").

It is to be understood that modifications can be made to the preferred embodiment as described above without departing from the spirit and scope of the invention.

What is claimed is:

1. A non-volatile semiconductor storage cell formed on a semiconductor substrate, the cell having an overwrite capability such that successive first and second logic states may be overwritten into the cell without intervening erase cycles, comprising:
   a first surface region defined on said substrate, said first surface region having a conductive state indicative of a logic state stored by the cell;
   a first diffusion region formed in said substrate adjacent said first surface region, said first diffusion region being biased at approximately 0 volts to set said first surface region at a first conductive state indicative of a first logic state when writing said first logic state into the cell, and being biased at not more than approximately five volts to set said first surface region at a second conductive state indicative of said second logic state when writing said second logic state into the cell,
   a floating gate electrode disposed above and insulated from said substrate, said floating gate electrode at least partially determining the conductive state of said first surface region; and
   first and second program gates disposed on said floating gate electrode,
   each of said first and second program gates receiving independent control signals, such that said first program gate removes charge from said floating gate electrode to write said first logic state into the cell only when said cell does not currently store said first logic state, or said second program gate injects charge into said floating gate electrode to write said second logic state into the cell only when said cell does not currently store said second logic state, when said first surface region is at said first and second conductive states, respectively, said program gates overwriting successive logic states into the cell.

2. The storage cell as recited in claim 1, wherein each of said first and second program gates comprises a layer of dual electron injector structure (DEIS) material overlaid by a first layer of polycrystalline silicon.

3. The storage cell as recited in claim 2, wherein said floating gate electrode comprises a second layer of polycrystalline silicon.

4. The storage cell as recited in claim 1, wherein said first surface region is defined by said first diffusion region and a second diffusion region formed in said substrate.

5. The storage cell as recited in claim 4, further comprising:
   a third diffusion region formed in said substrate, said third diffusion comprising a diffused bit line; and
   means for coupling a signal on said diffused bit line to said first diffusion region.

6. The storage cell as recited in claim 4, wherein said first and second diffusion regions comprise the source and drain electrodes of a field effect transistor (FET), said first surface region comprising the channel region of said transistor.

7. A memory cell formed on a semiconductor substrate, the cell having an overwrite capability such that successive logic states may be overwritten into the cell without intervening erase cycles, comprising:
   a channel region formed on said semiconductor substrate, said channel region having a conductive state indicative of a logic state stored in the cell;
   a first diffusion region formed in said substrate adjacent said channel region, said first diffusion region being biased at approximately 0 volts to set said channel region at a first conductive state indicative of a first logic state when writing said first logic state into the cell, and being biased at not more than approximately 5 volts to set said channel region at a second conductive state indicative of said second logic state when writing said second logic state into the cell,
   a floating gate electrode disposed above said channel region and insulated form said substrate, said floating gate electrode at least partially determining said conductive state of said channel region;
   a layer of charge injection material deposited on said floating gate electrode; and
   a polysilicon layer disposed above said charge injection material layer, said polysilicon layer and said charge injection material layer being etched to form first and second program gates;
   said first and second program gates removing charge from and injecting charge into, , respectively, said floating gate electrode in order to write said first and second logic states, respectively, into the cell, as a function of said channel region being at said first and second conductive states, respectively, said program gates only removing and injecting charge, respectively if the cell does not currently store said first and second logic states, respectively, said program gates overwriting said logic states into the cell.

8. The memory cell as recited in claim 7, wherein said semiconductor substrate has second, third, and fourth diffusion regions implanted therein, wherein
   said first diffusion region comprising a source diffusion,
   said second diffusion region comprising a drain diffusion,
   said third diffusion region abutting said source diffusion and extending toward said drain diffusion, said channel region being bounded by said first and said third diffusion regions, and said fourth diffusion region comprising a diffused bit line.

9. The memory cell as recited in claim 8, further comprising a word line device for coupling signals from said diffused bit line to said source diffusion.

10. The memory cell as recited in claim 7, wherein said charge injection material has an electrical characteristic analogous to that of two back-to-back connected diodes.

11. The memory cell as recited in claim 10, wherein said charge injection material comprises a layer of dual electron injector structure (DEIS) material.

12. A non-volatile memory cell formed on a semiconductor substrate, the cell having an overwrite capability such that first and second logic states may be successively overwritten into the cell without intervening erase cycles, , comprising;
    a discrete surface region formed on said semiconductor substrate and bounded by first and second diffusion regions implanted in said substrate the conductive state of said surface region being indicative of a logic state stored in the cell;
    means for biasing said first diffusion region at approximately 0 volts to set said discrete surface region at a first conductive state indicative of a first logic state when writing said first logic state into the cell, and for biasing said first diffusion region at not more than approximately 5 volts to set said discrete surface region at a second conductive state indicative of said second logic state when writing said second logic state into the cell;
    an insulator layer formed on said substrate;
    a first polysilicon layer formed on said insulator layer;
    said first polysilicon layer, said insulator layer and at least one of said diffusion regions forming a first capacitor;
    a layer of charge injection material deposited on said first polysilicon layer;
    a second polysilicon layer formed on said layer of charge injection material;
    said second polysilicon layer and said charge injection layer being etched to form first and second programming gates, said first and second programming gates combining with said first polysilicon layer to form second and third capacitors, respectively, said second and third capacitors being commonly connected to said first capacitor; and
    means for applying control signals to said second and third capacitors, said second capacitor removing charge from said first polysilicon layer when said discrete region is at said first conductive state and only when the cell does not currently store said first logic state, in order to write said first logic state into the cell and said third capacitor injecting charge into said first polysilicon layer when said discrete channel region is at said second conductive state and only when the cell does not currently store said second logic state in order to write a second logic state into the cell, said logic states being overwritten into the cell.

13. The memory cell as recited in claim 12, wherein said means for biasing said first diffusion region comprises a bit line diffusion region implanted in said substrate and a word line device for coupling data signals from said bit line diffusion onto said first diffusion region.

14. A non-volatile memory cell formed on a semiconductor substrate, the memory cell having an overwrite capability such that successive logic states may be overwritten into the memory cell without intervening erase cycles, comprising:
    a first diffusion region formed in said substrate;
    a second diffusion region formed in said substrate;
    a third diffusion region formed in said substrate, said third diffusion region abutting said second diffusion region and extending toward said first diffusion region, said first and third diffusion regions defining a channel region therebetween, the conductive state of said channel region reflecting a logic state stored by the cell;
    an insulator layer disposed on said substrate;
    a floating gate electrode disposed on said insulator layer, said floating gate electrode storing charge which at least partially determines the conductive state of said channel region;
    first and second program gates disposed on said floating gate electrode, said first program gate removing charge from said floating gate to write said first logic state into the cell only when the memory cell does not currently store said first logic state, and said second program gate injecting charge into said floating gate to write said second logic state into the cell only when the memory cell does not currently store said second logic state;
    a fourth diffusion region formed in said substrate, said fourth diffusion comprising a diffused bit line;
    a word line device; and
    control means for applying first and second control signals to said first and second program gates, respectively, and for applying a signal to said word line device such that data signals on said diffused bit line are coupled onto said second and third diffusion regions, said second and third diffusion regions being biased by said diffused bit line to approximately 0 volts to set said channel region at a first conductive state when said first logic state is to be written into the cell, and said second and third diffusion regions being biased by said diffused bit line to not more than approximately five volts to set said channel region at a second conductive state when said second logic state is to be written into the cell said control means enabling said first and second program gates to write sequential logic states into the cell without the use of intervening erase cycles.

* * * * *